(12) United States Patent
Berkeley et al.

(10) Patent No.: US 6,884,502 B2
(45) Date of Patent: Apr. 26, 2005

(54) ALUMINUM OXIDE COATED HONEYCOMB FOR S2S AND S3S SEALING SYSTEM WITH EXTENDED OXIDATION LIFE

(75) Inventors: Dalero W. Berkeley, Greenville, SC (US); Chek Beng Ng, Albany, NY (US); Raymond Edward Chupp, Glenville, NY (US); Jeffrey R. Thyssen, Delmar, NY (US); Don Mark Lipkin, Niskayuna, NY (US); Farshad Ghasripoor, Scotia, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/452,055

(22) Filed: Jun. 3, 2003

(65) Prior Publication Data

US 2004/0247926 A1 Dec. 9, 2004

(51) Int. Cl.[7] .................................................. B32G 9/00
(52) U.S. Cl. ........................ 428/336; 277/650; 277/627; 428/701; 427/445
(58) Field of Search .................................. 428/701, 336; 427/445; 277/627, 650

(56) References Cited

U.S. PATENT DOCUMENTS

| 3,339,933 | A | * | 9/1967 | Foster | 277/415 |
|---|---|---|---|---|---|
| 4,218,066 | A | * | 8/1980 | Ackermann | 277/415 |
| 4,884,820 | A | * | 12/1989 | Jackson et al. | 277/415 |
| 5,026,273 | A | * | 6/1991 | Cornelison | 431/170 |
| 5,223,332 | A | * | 6/1993 | Quets | 428/701 |
| 5,334,570 | A | * | 8/1994 | Beauseigneur et al. | 502/439 |
| 5,350,566 | A | * | 9/1994 | Stringaro | 422/109 |
| 5,487,865 | A | * | 1/1996 | Hampton et al. | 419/5 |
| 5,721,188 | A | * | 2/1998 | Sung et al. | 502/439 |
| 6,254,963 | B1 | * | 7/2001 | Kondo | 428/116 |

* cited by examiner

Primary Examiner—Archene Turner
(74) Attorney, Agent, or Firm—Nixon & Vanderhye

(57) ABSTRACT

Oxidation resistant sealant system comprising a honeycomb component coated with an aluminum oxide layer.

5 Claims, 1 Drawing Sheet

Plain Honeycomb

Honeycomb with CVD Alumina

Haynes 214 Honeycomb coated with 5μm of $Al_2O_3$ using CVD Process.

Plain Honeycomb

Honeycomb with CVD Alumina

Fig. 1: Haynes 214 Honeycomb coated with 5μm of $Al_2O_3$ using CVD Process.

ALUMINUM OXIDE COATED HONEYCOMB FOR S2S AND S3S SEALING SYSTEM WITH EXTENDED OXIDATION LIFE

The present invention relates to an oxidation resistant seal system, which provides better clearance control to reduce hot gas leakage, decrease heat rate and improve turbine efficiency in gas turbines. More specifically, the invention provides an aluminum oxide coated honeycomb seal system, particularly adapted for use as gas path seal for Stage 2 and Stage 3 shrouds on E and F gas turbines.

BACKGROUND OF THE INVENTION

Currently honeycomb seals are used in a number of different locations in gas turbines, for example in stages 2 and 3 of the 7E gas turbine that form a seal against rails on shrouded buckets. Honeycomb is used as an abradable system, whereby the rotating rails on the buckets may incur into them during any transient closures between the buckets and the shroud. The incursion into the honeycomb is a sacrificial form of sealing forming a tight clearance, as the intention is that there be no damage to the bucket rails during the interaction. However, the primary problem with honeycomb, particularly in stage 2 shrouds, is its low resistance to oxidation. The honeycomb material is typically 75Ni-16Cr-4.5Al-3Fe-0.05C-0.01Y-0.5Mn-0.2Si-0.1Zr-0.01B (Haynes 214). The temperature range in this location of the turbine is generally in the range of 1500–1700° F. At ~1600° F., the oxidation life of a 0.005" thick honeycomb is less than 20,000 hours.

In order to extend the oxidation life of Haynes 214 honeycomb, wall thickness has to be increased to between 0.008–0.011". However, increasing the honeycomb wall thickness renders the honeycomb less abradable, thus increasing the risk of bucket rail damage during any transient rubs. Alternatively, use of other honeycomb materials such as oxide dispersion strengthened super alloys (e.g. FeCrAlY's) would create additional difficulties such as high costs and brittle behavior (loss of strength) at lower temperatures.

A need exists for an oxidation protected honeycomb seal system which extends the life of the honeycomb while at the same time providing clearance control to reduce hot gas leakage, decreased heat rate and improved turbine efficiency. The present invention seeks to fill that need.

BRIEF DESCRIPTION OF THE INVENTION

It has now been discovered surprisingly that it is possible to extend the oxidation life of a honeycomb sealing system by providing a protective aluminum oxide layer to coat the honeycomb. While enhancing the oxidation resistance of the Honeycomb, the application of the protective aluminum oxide layer does not have an adverse effect on abradability and erosion.

According to one aspect, the present invention provides an oxidation resistant seal system comprising a honeycomb component coated with an aluminum oxide layer. According to another aspect, there is provided a method of producing an oxidation resistant seal system, comprising coating a honeycomb component with an aluminum oxide layer.

Advantages of the high temperature sealing system of the invention are extended oxidation life, no or minimal blade wear and sufficient erosion resistance.

BRIEF DESCRIPTION OF THE DRAWING

The invention will now be described in more detail with reference to the accompanying drawing, which shows a Haynes 214 Honeycomb coated with 5 $\mu$m of $Al_2O_3$ using a CVD process.

DETAILED DESCRIPTION OF THE INVENTION

Figure 1:
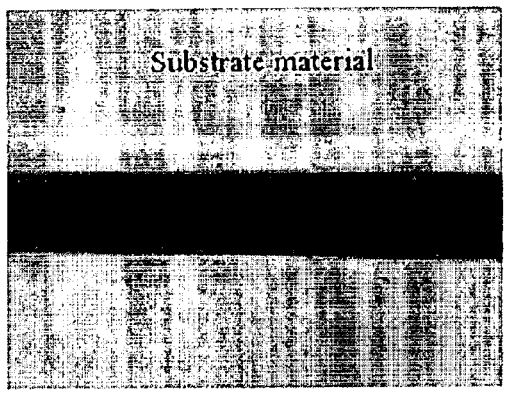
Figure 1:
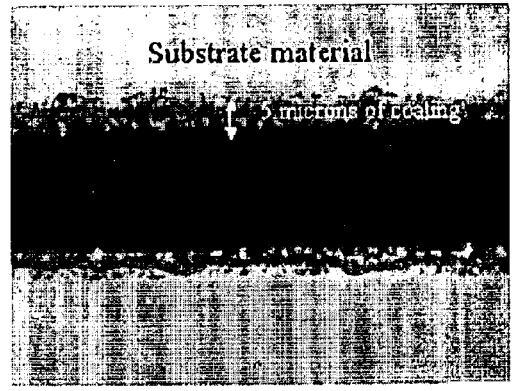

The present invention is based on the discovery that it is possible to take advantage of the inherent structural integrity of an existing sealing material, honeycomb, while bolstering the oxidation resistance of the substrate material by having a coating of oxidation resistant $Al_2O_3$ on its surface. This enhances the oxidation resistance, and hence the life of the sealing system, without compromising any of the other critical properties of the material.

The coating is applied to the honeycomb by conventional chemical vapor deposition (CVD). Alternatively, PVD (physical vapor deposition) may be employed, but this is less preferred to CVD.

The alumina coating generally has a thickness of about 3–10 microns, for example about 5 microns. The accompanying Figure shows a Haynes 214 Honeycomb coated with 5 $\mu$m of $Al_2O_3$ using a CVD process.

EXAMPLES

The following test results illustrate how the presence of an alumina coating on the honeycomb improves the life of the honeycomb.

TABLE

Data Collected at 2000° F.

| Time/hrs | A1 | A2 | A3 | A4 | Net Average Wt Gain (g) | Net Average Wt gain % | A5 | A6 | Net Average Wt Gain (g) | Net Average Wt Gain % |
|---|---|---|---|---|---|---|---|---|---|---|
| 0 | 14.2640 | 14.0082 | 14.9887 | 14.2005 | 0.0000 | 0.0000 | 14.5083 | 15.6282 | 0.0000 | 0.0000 |
| 168 | 14.2710 | 14.0154 | 14.9956 | 14.2078 | 0.0071 | 0.0494 | 14.5214 | 15.6398 | 0.0123 | 0.0820 |

Note:
A1–A4 = 5 mils wall thickness honeycomb (HC) with CVD aluminum oxide
A5–A6 = 5 mils wall thickness HC plain As illustrated in the Table above, the honeycomb with $Al_2O_3$ lasts about 1.7 times longer than the honeycomb seal without $Al_2O_3$ coating after 168 hours at 2000° F.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An oxidation resistant seal system comprising a honeycomb component coated with an aluminum oxide layer, wherein the aluminum oxide layer has a thickness of about 3–10 microns.

2. A system according to claim 1, wherein said component is adapted for use as a seal for Stage 2 and Stage 3 shrouds.

3. A system according to claim 1, wherein said aluminum oxide layer has a thickness of about 5 microns.

4. A method of producing an oxidation resistant seal system, comprising coating a honeycomb component with an aluminum oxide layer, wherein the aluminum oxide layer has a thickness of about 3–10 microns.

5. A method according to claim 4, wherein said aluminum oxide layer has a thickness of about 5 microns.

* * * * *